(12) United States Patent
Lee et al.

(10) Patent No.: US 10,950,306 B2
(45) Date of Patent: Mar. 16, 2021

(54) MEMORY DEVICE HAVING IMPROVED PROGRAM AND ERASE OPERATIONS AND OPERATING METHOD OF THE MEMORY DEVICE

(71) Applicant: SK hynix Inc., Icheon-si (KR)

(72) Inventors: Byung In Lee, Hwaseong-si (KR); Hee Joung Park, Seoul (KR); Keon Soo Shim, Icheon-si (KR); Sang Heon Lee, Chungcheongbuk-do (KR); Jae Il Tak, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/510,071

(22) Filed: Jul. 12, 2019

(65) Prior Publication Data
US 2020/0211650 A1 Jul. 2, 2020

(30) Foreign Application Priority Data
Jan. 2, 2019 (KR) .................. 10-2019-0000453

(51) Int. Cl.
| | | |
|---|---|---|
| *G11C 16/10* | (2006.01) | |
| *G11C 16/14* | (2006.01) | |
| *G11C 16/08* | (2006.01) | |
| *G11C 16/24* | (2006.01) | |
| *G11C 16/30* | (2006.01) | |
| *G11C 16/04* | (2006.01) | |

(52) U.S. Cl.
CPC .......... *G11C 16/10* (2013.01); *G11C 16/0483* (2013.01); *G11C 16/08* (2013.01); *G11C 16/14* (2013.01); *G11C 16/24* (2013.01); *G11C 16/30* (2013.01)

(58) Field of Classification Search
CPC ..... G11C 16/10; G11C 16/0483; G11C 16/30; G11C 16/24; G11C 16/08; G11C 16/14
See application file for complete search history.

(56) References Cited

U.S. PATENT DOCUMENTS

| | | | | |
|---|---|---|---|---|
| 2011/0019486 | A1* | 1/2011 | Jang .................. | G11C 16/0483 365/185.25 |
| 2017/0206966 | A1* | 7/2017 | Lee .......................... | G11C 8/08 |

FOREIGN PATENT DOCUMENTS

| | | |
|---|---|---|
| KR | 1020160043747 A | 4/2016 |
| KR | 1020160057539 A | 5/2016 |

\* cited by examiner

*Primary Examiner* — David Lam
(74) *Attorney, Agent, or Firm* — William Park & Associates Ltd.

(57) ABSTRACT

A memory device includes a memory cell array having a plurality of memory blocks sharing a source line, a peripheral circuit for performing a program operation and an erase operation on a selected memory block among the plurality of memory blocks, and a control logic for controlling the peripheral circuit. The control logic controls the peripheral circuit such that some source select transistors adjacent to the source line among a plurality of source select transistors included in an unselected memory block among the plurality of memory blocks are floated in a source line precharge operation during the program operation.

20 Claims, 11 Drawing Sheets

MEMORY DEVICE HAVING IMPROVED PROGRAM AND ERASE OPERATIONS AND OPERATING METHOD OF THE MEMORY DEVICE

CROSS-REFERENCE TO RELATED APPLICATION

The present application claims priority under 35 U.S.C. § 119(a) to Korean patent application number 10-2019-0000453, filed on Jan. 2, 2019, in the Korean Intellectual Property Office, the entire disclosure of which is incorporated herein by reference.

BACKGROUND

1. Technical Field

The present disclosure generally relates to an electronic device, and more particularly, to a memory device and an operating method thereof.

2. Related Art

In the current computer environment computing systems can be used anywhere and anytime. This promotes increasing usage of portable electronic devices such as mobile phones, digital cameras, notebook computers, and the like. Such portable electronic devices generally include a memory system using a memory device, i.e., a data storage device. The data storage device is used as a main memory device or an auxiliary memory device of the portable electronic devices.

A data storage device using a memory device has excellent stability and durability, high information access speed, and low power consumption, since there is no mechanical driving part. In memory systems having such advantages, the data storage device can include a Universal Serial Bus (USB) memory device, memory cards having various interfaces, a Solid State Drive (SSD), and the like.

The memory device is generally classified into a volatile memory device and a nonvolatile memory device.

The nonvolatile memory device has relatively slow write and read speeds, but retains stored data even when the supply of power is interrupted. Thus, the nonvolatile memory device is used to store data to be retained regardless of whether power is supplied.

Examples of the volatile memory include a Read Only Memory (ROM), a Mask ROM (MROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like. The flash memory is classified into a NOR type flash memory and a NAND type flash memory.

SUMMARY

Exemplary embodiments of the present disclosure provide memory devices capable of reducing loading of a source line in a source line precharge operation during a program operation, and an operating method of the memory devices.

According to an aspect of the present disclosure, there is provided a memory device having a memory cell array including a plurality of memory blocks sharing a source line, a peripheral circuit that performs a program operation and an erase operation on a selected memory block among the plurality of memory blocks, and a control logic that controls the peripheral circuit, wherein the control logic controls the peripheral circuit such that some source select transistors adjacent to the source line among a plurality of source select transistors included in an unselected memory block among the plurality of memory blocks are floated in a source line precharge operation during the program operation.

According to another aspect of the present disclosure, there is provided a method for operating a memory device, the method including: floating some source select transistors among a plurality of source select transistors included in an unselected memory block among a plurality of memory blocks each including the plurality of source select transistors, a plurality of memory cells, and a drain select transistor, which are coupled in series between a source line and a bit line, applying a precharge voltage to the source line, and applying a program voltage and a pass voltage to word lines coupled to a selected memory block among the plurality of memory blocks.

According to still another aspect of the present disclosure, there is provided a method for operating a memory device, the method including: providing a memory block including a plurality of source select transistors, a plurality of memory cells, and a drain select transistor, which are coupled in series between a source line and a bit line, applying a first erase voltage to the source line, floating some source select transistors among the plurality of source select transistors, increasing the first erase voltage to a second erase voltage and applying the second erase voltage to the source line, and floating the other source select transistors among the plurality of source select transistors.

BRIEF DESCRIPTION OF THE DRAWINGS

Exemplary embodiments will now be described more fully hereinafter with reference to the accompanying drawings. The exemplary embodiments can be embodied in different forms and should not be construed as limited to the embodiments set forth herein. Rather, these exemplary embodiments are provided so that this disclosure will be thorough and complete, and will fully convey the scope of the exemplary embodiments to those skilled in the art.

In the drawing figures, dimensions can be exaggerated for clarity of illustration. It will be understood that when an element is referred to as being "between" two elements, it can be the only element between the two elements, or one or more intervening elements can also be present. Like reference numerals refer to like elements throughout.

DETAILED DESCRIPTION

The specific structural or functional description disclosed herein is merely illustrative for the purpose of describing exemplary embodiments according to the teachings of the present disclosure. The exemplary embodiments according to the concept of the present disclosure can be implemented in various forms, and should not be construed as limited to the exemplary embodiments set forth herein.

The exemplary embodiments according to the concepts of the present disclosure can be modified in various manners and have various shapes. Thus, the exemplary embodiments are illustrated in the drawings and are intended to be described herein in detail. However, the exemplary embodiments according to the concept of the present disclosure are not construed as limited to specified disclosures, and include all changes, equivalents, or substitutes that do not depart from the spirit and technical scope of the present disclosure.

While terms such as "first" and "second" can be used to describe various components, such components must not be understood as being limited to the above terms. The above terms are used only to distinguish one component from another. For example, a first component can be referred to as a second component without departing from the scope of rights of the present disclosure, and likewise a second component can be referred to as a first component.

It will be understood that when an element is referred to as being "connected" or "coupled" to another element, it can be directly connected or coupled to the other element or intervening elements can also be present. In contrast, when an element is referred to as being "directly connected" or "directly coupled" to another element, no intervening elements are present. Also, other expressions describing relationships between components such as "between," "immediately between" or "adjacent to" and "directly adjacent to" can be construed similarly.

The terms used in the present application are merely used to describe particular exemplary embodiments, and are not intended to limit the present disclosure. Singular forms in the present disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof can exist or can be added.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

In describing those exemplary embodiments, description will be omitted for techniques that are well known to the art to which the present disclosure pertains, and are not directly related to the present disclosure. This intends to disclose the gist of the present disclosure more clearly by omitting unnecessary description.

Hereinafter, exemplary exemplary embodiments of the present disclosure will be described in detail with reference to the accompanying drawings in order for those skilled in the art to be able to readily implement the technical spirit of the present disclosure.

Figure 1:
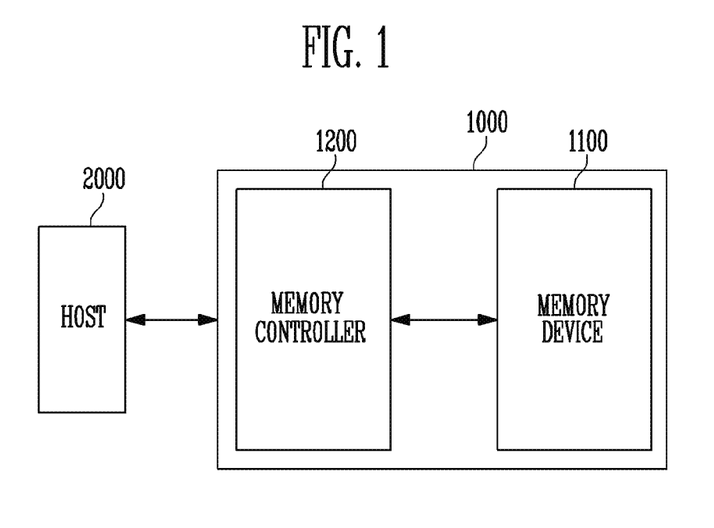
FIG. 1 is a diagram illustrating a memory system according to an exemplary embodiment of the present disclosure.

FIG. 1 is a diagram illustrating a memory system according to an exemplary embodiment of the present disclosure.

Referring to FIG. 1, memory system 1000 can include memory device 1100 for storing data and memory controller 1200 for controlling memory device 1100 under the control of host 2000.

The host 2000 can communicate with memory system 1000 by using an interface protocol such as Peripheral Component Interconnect-Express (PCI-E), Advanced Technology Attachment (ATA), Serial ATA (SATA), Parallel ATA (PATA), or Serial Attached SCSI (SAS). Interface protocols between host 2000 and memory system 1000 are not limited to the above-described examples, and can be one of other interface protocols such as a Universal Serial Bus (USB), a Multi-Media Card (MMC), an Enhanced Small Disk Interface (ESDI), and Integrated Drive Electronics (IDE).

Memory controller 1200 can control the overall operations of memory system 1000, and control data exchange between host 2000 and memory device 1100. For example, memory controller 1200 can program or read data by controlling the memory device 1100 in response to a request from host 2000. In some exemplary embodiments, memory device 1100 can include a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), and a flash memory.

Memory device 1100 can perform a program, read or erase operation under the control of memory controller 1200.

Figure 2:
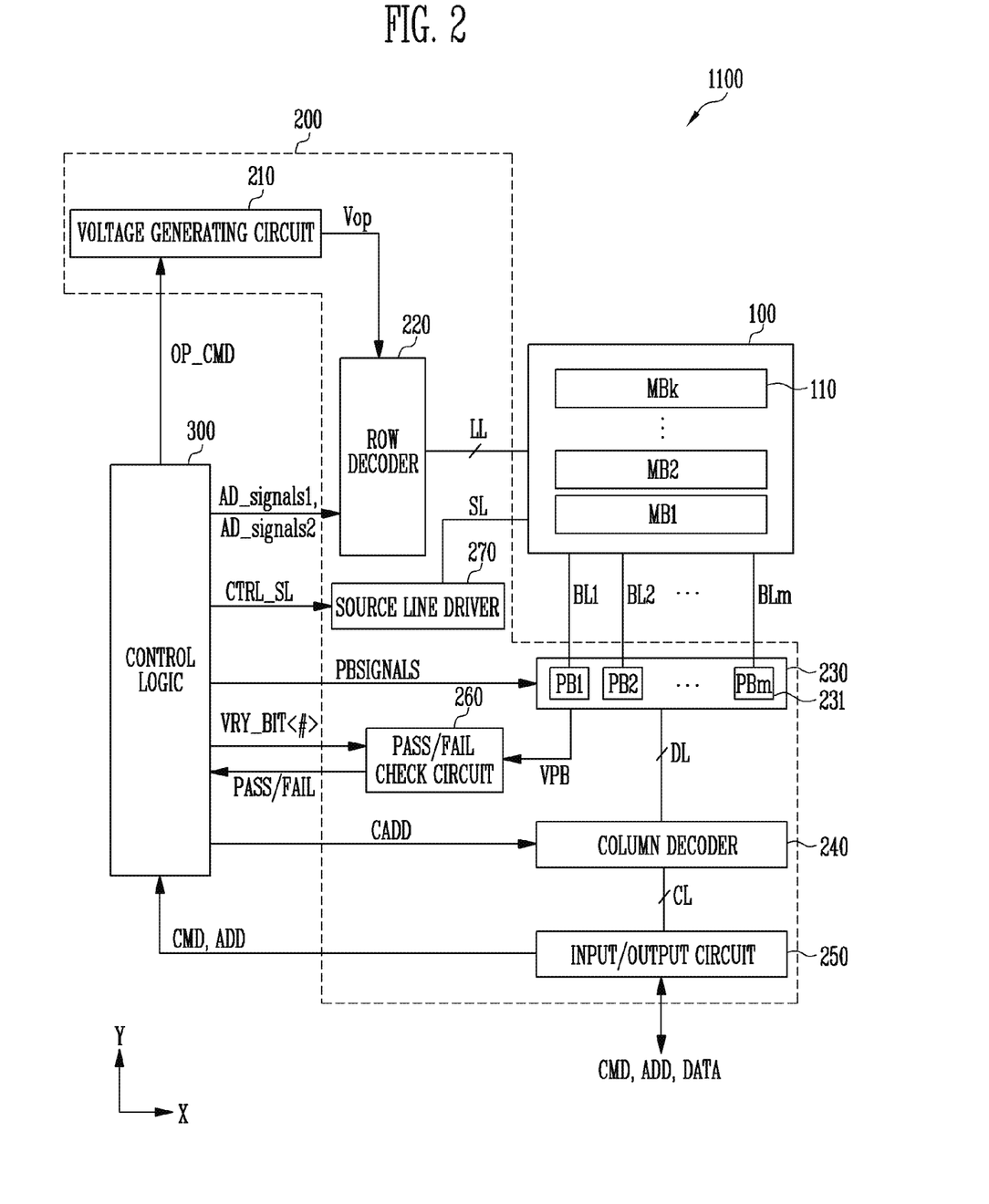
FIG. 2 is a diagram illustrating a memory device shown in FIG. 1.

FIG. 2 is a diagram illustrating the memory device shown in FIG. 1.

Referring to FIG. 2, memory device 1100 can include memory cell array 100 that stores data. Memory device 1100 can include peripheral circuit 200 configured to perform a program operation for storing data in memory cell array 100, a read operation for outputting the stored data, and an erase operation for erasing the stored data. Memory device 1100 can include control logic 300 that controls peripheral circuit 200 under the control of memory controller 1200 shown in FIG. 1.

Memory cell array 100 can include a plurality of memory blocks MB1 to MBk (k being a positive integer) 110. Local lines LL and bit lines BL1 to BLm (m being a positive integer) can be coupled to the memory blocks MB1 to MBk 110. For example, local lines LL can include a first select line, a second select line, and a plurality of word lines arranged between the first and second select lines. Also, local lines LL can include dummy lines arranged between the first select line and the word lines and between the second select line and the word lines. The first select line can be a source select line, and the second select line can be a drain select line. The first select line can include at least two source select lines. For example, local lines LL can include word lines, drain and source select lines, and source lines SL. For example, local lines LL can further include dummy lines. Local lines LL can be coupled to memory blocks MB1 to MBk 110, respectively, and bit lines BL1 to BLm can be commonly coupled to memory blocks MB1 to MBk 110. Memory blocks MB1 to MBk 110 can be implemented in a two-dimensional or three-dimensional structure. For example, memory cells can be arranged in a direction parallel to a substrate in memory blocks 110 having a two-dimensional structure. For example, memory cells can be arranged in a direction vertical to a substrate in memory blocks 110 having a three-dimensional structure.

Peripheral circuit 200 can be configured to perform program, read, and erase operations of a selected memory block 110 under the control of control logic 300. For example, peripheral circuit 200 can include voltage generating circuit 210, row decoder 220, page buffer group 230, column decoder 240, input/output circuit 250, pass/fail check circuit 260, and source line driver 270.

Voltage generating circuit 210 can generate various operating voltages Vop used for program, read, and erase operations in response to operation signal OP_CMD. Also, voltage generating circuit 210 can selectively discharge local lines LL in response to operation signal OP_CMD. For example, voltage generating circuit 210 can generate a program voltage, a verify voltage, a pass voltage, a turn-on voltage, a turn-off voltage, and the like under the control of control logic 300.

Row decoder 220 can transfer operating voltages Vop to local lines LL coupled to selected memory block 110 in response to row decoder control signals AD_signals1 and AD_signals2. For example, row decoder 220 can selectively apply operating voltages (e.g., a program voltage, a verify voltage, a pass voltage, and the like) generated by voltage generating circuit 210 to the word lines among logical lines LL in response to row decoder control signals AD_signals1, and apply operating voltages (e.g., a turn-on voltage and a turn-off voltage) generated by voltage generating circuit 210 to the source select line and the drain select line among local lines LL in response to row decoder control signals AD_signals2. Also, row decoder 220 can float some source select lines among a plurality of source select lines in a source line precharge operation during a program operation in response to row decoder control signals AD_signals2. Also, row decoder 220 can generate a Gate Induce Drain Leakage (GIDL) in a lower channel of a source select transistor by floating a plurality of source select lines to which a ground voltage (e.g., 0 V) is applied in an erase operation in response to row decoder control signals AD_signals2. Row decoder 220 can first float some source select lines among the plurality of source select lines in an operation for generating the GIDL and then float the other source select lines.

Page buffer group 230 can include a plurality of page buffers PB1 to PBm 231 coupled to bit lines BL1 to BLm. Page buffers PB1 to PBm 231 can operate in response to page buffer control signals PBSIGNALS. For example, page buffers PB1 to PBm 231 can temporarily store data received through bit lines BL1 to BLm, or sense voltages or current of bit lines BL1 to BLm in a read or verify operation.

Column decoder 240 can transfer data between input/output circuit 250 and page buffer group 230 in response to column address CADD. For example, column decoder 240 can exchange data with page buffers 231 through data lines DL, or exchange data with input/output circuit 250 through column lines CL.

Input/output circuit 250 can transfer command CMD and address ADD, which are received from memory controller 1200 shown in FIG. 1, to control logic 300, or exchange data DATA with column decoder 240.

In a read operation and a verify operation, pass/fail check circuit 260 can generate a reference current in response to allow bit VRY_BIT<#>, and output pass signal PASS or fail signal FAIL by comparing sensing voltage VPB received from page buffer group 230 with a reference voltage generated by the reference current.

Source line driver 270 can be coupled to a memory cell included in memory cell array 100 through source line SL, and control a voltage applied to source line SL. In an example, in an erase operation, source line driver 270 can apply a pre-erase voltage to source line SL, increase the pre-erase voltage to a first erase voltage, and then increase the first erase voltage to a second erase voltage to be applied. Source line driver 270 can receive source line control signal CTRL_SL from control logic 300, and control a source line voltage applied to the source line SL, based on source line control signal CTRL_SL.

Control logic 300 can control peripheral circuit 200 by outputting operation signal OP_CMD, row decoder control signals AD_signals1 and AD_signals2, page buffer control signals PBSIGNALS, and allow bit VRY_BIT<#> in response to command CMD and address ADD. Also, control logic 300 can determine whether the verify operation has passed or failed in response to pass or fail signal PASS or FAIL.

As described above, in the source line precharge operation during the program operation, memory device 1100 according to the exemplary embodiment of the present disclosure floats source select transistors adjacent to the source line, and applies a turn-off voltage to the other source select transistors. Also, in the erase operation, memory device 1100 floats source select transistors adjacent to the source line in a state in which a first erase voltage is applied to the source line, and floats the other source select transistors in a state in which a second erase voltage higher than the first erase voltage is applied.

Figure 3:
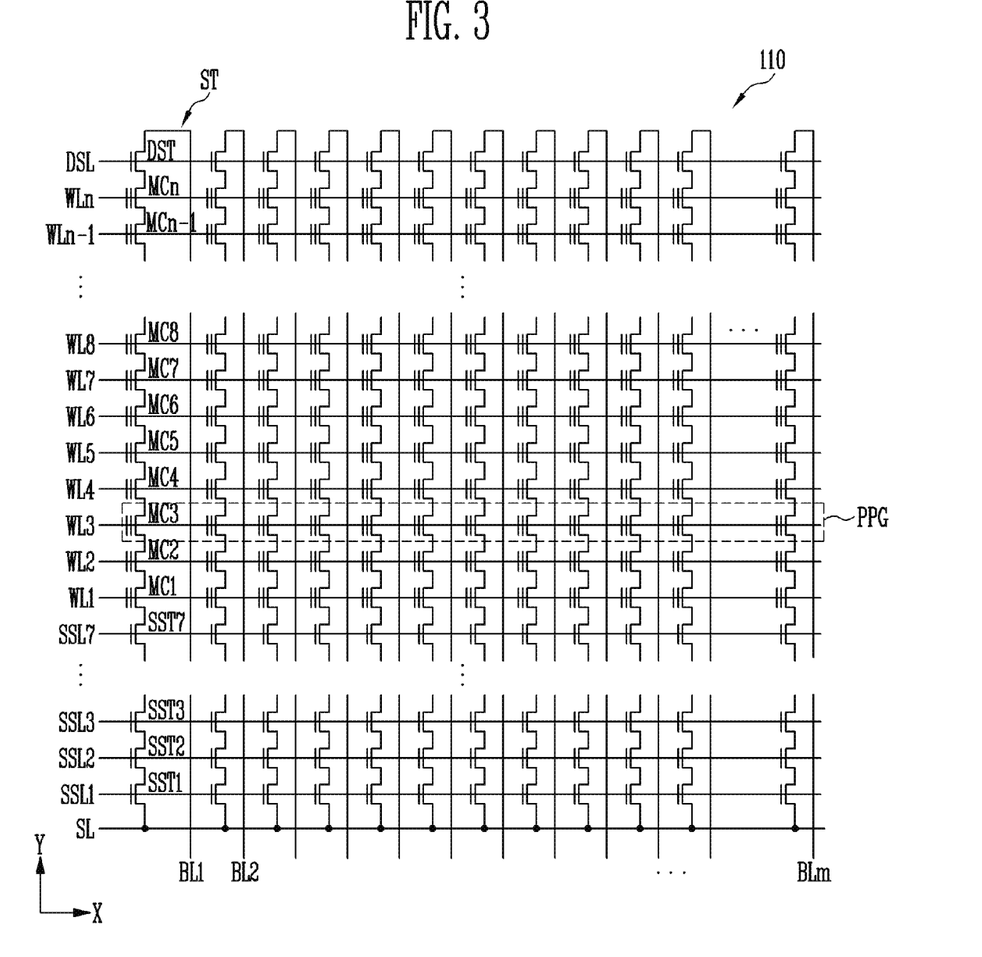
FIG. 3 is a diagram illustrating a memory block shown in FIG. 2.

FIG. 3 is a diagram illustrating the memory block shown in FIG. 2.

Referring to FIG. 3, memory block 110 can be coupled to a plurality of word lines WL1 to WLn arranged in parallel to one another between a plurality of first select lines SSL1 to SSL7 and second select line DSL. The plurality of first select lines SSL1 to SSL7 can be source select lines, and second select line DSL can be a drain select line. Although seven first select lines SSL1 to SSL7 are illustrated in the drawing, the present disclosure is not limited thereto, and at least two first select lines can be disposed. In addition, at least one second select line DSL can be disposed.

First memory block 110 can include a plurality of strings ST coupled between bit lines BL1 to BLm and source line SL. Bit lines BL1 to BLm can be coupled to the plurality of strings ST, respectively, and source line SL can be commonly coupled to the plurality of strings ST. Strings ST can be configured identically to one another, and therefore, string ST coupled to first bit line BL1 will be described in detail as an example.

String ST can include a plurality of source select transistors SST1 to SST7, a plurality of memory cells MC1 to MCn, and drain select transistor DST, which are coupled in series to each other between source line SL and first bit line BL1.

A source of source select transistor SST1 disposed at an outermost portion among the plurality of source select transistors SST1 to SST7 can be coupled to source line SL, and a drain of drain select transistor DST can be coupled to first bit line BL1. Memory cells MC1 to MCn can be coupled in series between source select transistor SST7 and drain select transistor DST. Gates of source select transistors SST1 to SST7 included in the plurality of strings ST can be coupled to source select lines SSL1 to SSL7. Gates of drain select transistors DST can be coupled to drain select line DSL. Gates of memory cells MC1 to MCn can be coupled to the plurality of word lines WL1 to WLn. A group of memory cells coupled to the same word line among the memory cells included in different strings ST can be referred to as physical page PPG. Therefore, physical pages PPG of which number corresponds to that of word lines WL1 to WLn can be included in first memory block 110.

One memory cell MC can store data of one bit. This is generally called as a single level cell (SLC). One physical page PPG can store one logical page (LPG) data. One LPG data can include data bits of which number corresponds to that of cells included in one physical page PPG. In addition, one memory cell MC can store data of two or more bits. This is generally called a multi-level cell (MLC). One physical page PPG can store two or more LPG data.

Figure 4:
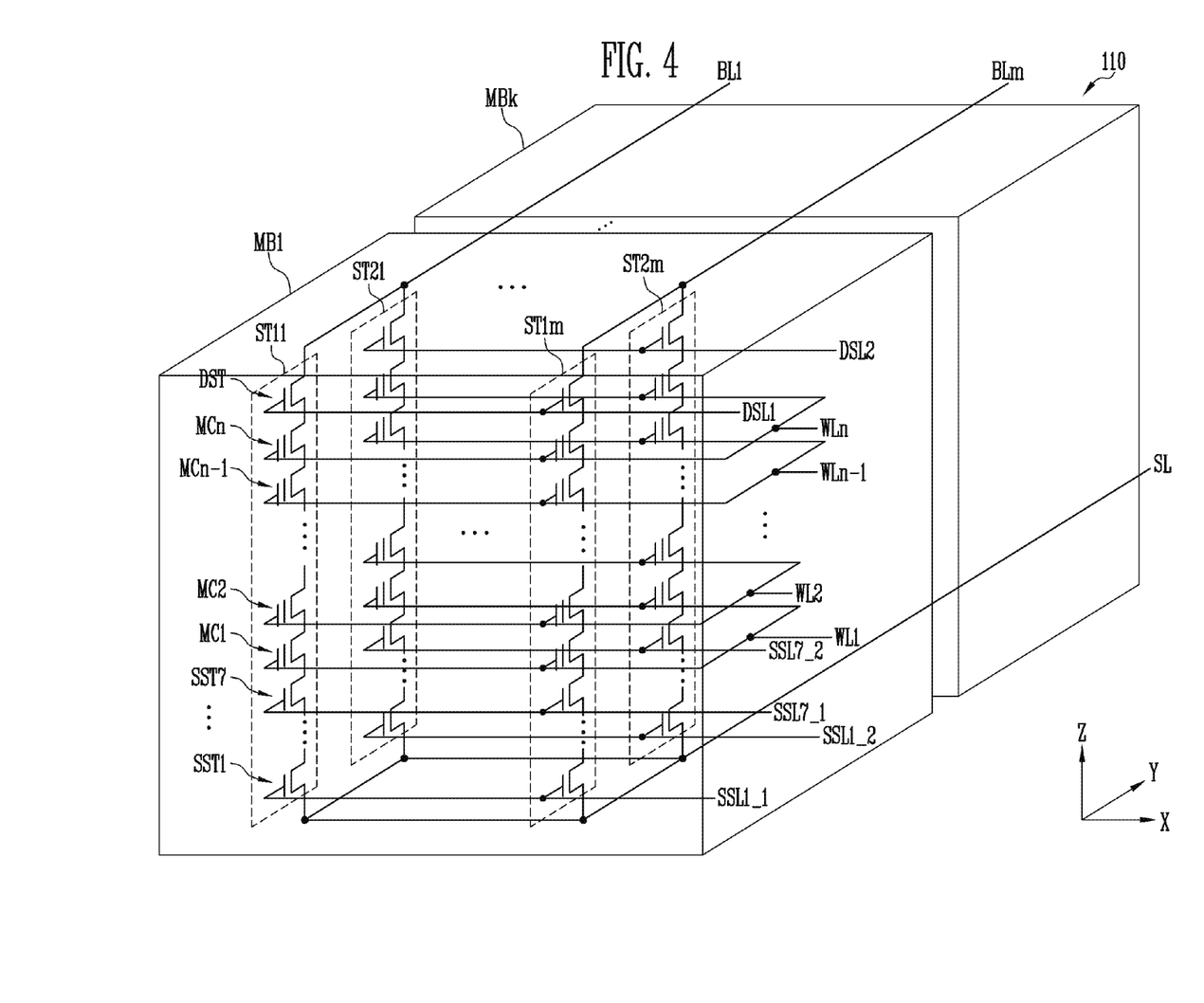
FIG. 4 is a diagram illustrating an exemplary embodiment of a three-dimensionally configured memory block.

FIG. 4 is a diagram illustrating an exemplary embodiment of a three-dimensionally configured memory block.

Referring to FIG. 4, memory cell array 100 can include a plurality of memory blocks MB1 to MBk 110. Memory block 110 can include a plurality of strings ST11 to ST1*m* and ST21 to ST2*m*. Each of the plurality of strings ST11 to ST1*m* and ST21 to ST2*m* can extend along a vertical direction (Z direction). In memory block 110, m strings can be arranged in a row direction (X direction). Although a case where two strings are arranged in a column direction (Y direction) is illustrated in FIG. 4, this is for convenience of description, and three or more strings can be arranged in the column direction (Y direction).

Each of the plurality of strings ST11 to ST1*m* and ST21 to ST2*m* can include a plurality of source select transistors SST1 to SST7, first to nth memory cells MC1 to MCn, and at least one drain select transistor DST.

Source select transistor SST1 disposed at an outermost portion of each string can be coupled to source line SL. The plurality of source select transistors SST1 to SST7 of strings arranged on the same row can be coupled to the same source select lines SSL1 to SSL7. Source select transistors SST1 to SST7 of strings ST11 to ST1*m* arranged on a first row can be coupled to first source select lines SSL1_1 to SSL7_1. Source select transistors SST1 to SST7 of strings ST21 to ST2*m* arranged on a second row can be coupled to second source select lines SSL1_2 to SSL7_2. In another exemplary embodiment, source select transistors SST1 to SST7 of strings ST11 to ST1*m* and ST21 to ST2*m* can be commonly coupled to the same source select lines SSL1 to SSL7.

First to nth memory cells MC1 to MCn of each string can be coupled in series to each other between source select transistor SST7 and drain select transistor DST. Gates of first to nth memory cells MC1 to MCn can be coupled to first to nth word lines WL1 to WLn, respectively.

In an exemplary embodiment, at least one of first to nth memory cells MC1 to MCn can be used as a dummy memory cell. When a dummy memory cell is provided, the voltage or current of a corresponding string can be stably controlled. Accordingly, the reliability of data stored in memory block 110 can be improved.

Drain select transistor DST of each string can be coupled between a bit line and memory cells MC1 to MCn. Drain select transistors DST of strings arranged in a row direction can be coupled to a drain select line extending in the row direction. Drain select transistors DST of strings CS11 to CS1*m* on the first row can be coupled to first drain select line DSL1. Drain select transistors DST of strings CS21 to CS2*m* on the second row can be coupled to second drain select line DSL2.

Figure 5:
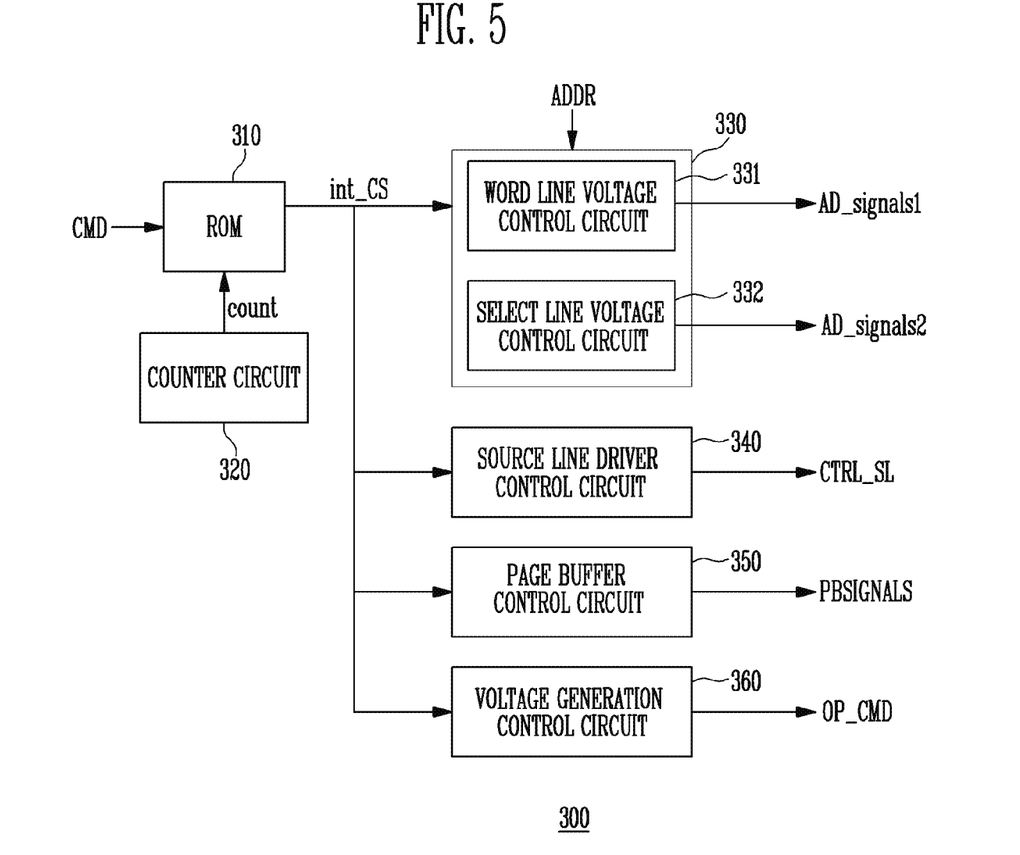
FIG. 5 is a diagram illustrating a control logic shown in FIG. 2.

FIG. 5 is a diagram illustrating the control logic shown in FIG. 2.

Referring to FIG. 5, control logic 300 can include ROM 310, counter circuit 320, row decoder control circuit 330, source line driver control circuit 340, page buffer control circuit 350, and voltage generation control circuit 360.

An algorithm for performing various general operations (e.g., a program operation, a read operation, an erase operation, and the like) of the memory device can be stored in ROM 310. ROM 310 outputs internal control signal int_CS in response to command CMD and a counting signal count.

Counter circuit 320 generates and outputs a counting signal count counted in a certain period in a general operation of the memory device.

Row decoder control circuit 330 generates and outputs row decoder control signals AD_signals1 and AD_signals2 for controlling row decoder 220 shown in FIG. 2 in response to internal control signal int_CS output by ROM 310.

Row decoder control circuit 330 can include word line voltage control circuit 331 and select line voltage control circuit 332.

Word line voltage control circuit 331 generates and outputs row decoder control signals AD_signals1 in response to internal control signal int_CS. Row decoder control signals AD_signals1 can be signals for controlling row decoder 220 shown in FIG. 2 to selectively apply operating voltages (e.g., a program voltage, a pass voltage, and the like) generated by voltage generating circuit 210 shown in FIG. 2 to the word lines among local lines LL.

Select line voltage control circuit 332 generates and outputs row decoder control signals AD_signals2 in response to internal control signal int_CS. Row decoder control signals AD_signals2 can be signals for controlling row decoder 220 shown in FIG. 2 to selectively apply operating voltages (e.g., a turn-on voltage and a turn-off voltage) generated by voltage generating circuit 210 shown in FIG. 2 to the plurality of source select lines and the drain select line among local lines LL. Also, row decoder control signals AD_signals2 can be signals for controlling row decoder 220 shown in FIG. 2 to float some source select transistors adjacent to the source line among the plurality of source select transistors and apply a turn-off voltage to the other source select transistors in a source line precharge operation during a program operation. Also, row decoder control signals AD_signals2 can be signals for controlling row decoder 220 shown in FIG. 2 to float some source select transistors adjacent to the source line when a first erase voltage is applied to the source line during an erase operation, and float the other source select transistors when a second erase voltage higher than the first erase voltage is applied to the source line.

Source line driver control circuit 340 generates and outputs source line control signal CTRL_SL for controlling source line driver 270 in response to internal control signal int_CS output by ROM 310. Source line control signal CTRL_SL can be a signal for controlling source line driver 270 shown in FIG. 2 to apply a pre-erase voltage, the first erase voltage, and the second erase voltage to the source line of memory cell array 100.

Page buffer control circuit 350 generates and outputs page buffer control signals PBSIGNALS for controlling page buffer group 230 shown in FIG. 2 in response to internal control signal int_CS output by ROM 310.

Voltage generation control circuit 360 generates and outputs operation signal OP_CMD for controlling voltage generating circuit 210 shown in FIG. 2 in response to internal control signal int_CS output by ROM 310.

Figure 6:
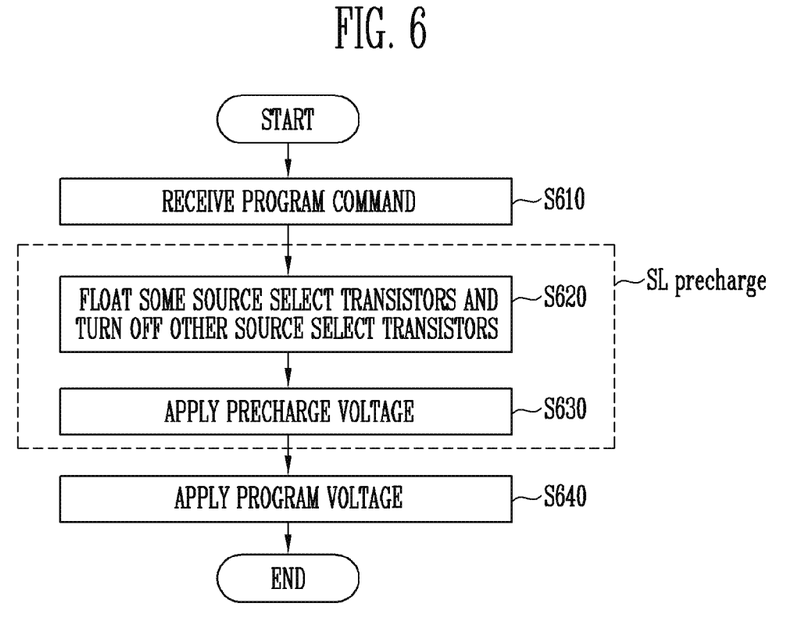
FIG. 6 is a flowchart illustrating a program operation of the memory device according to an exemplary embodiment of the present disclosure.

FIG. 6 is a flowchart illustrating a program operation of the memory device according to an exemplary embodiment of the present disclosure.

Figure 7:
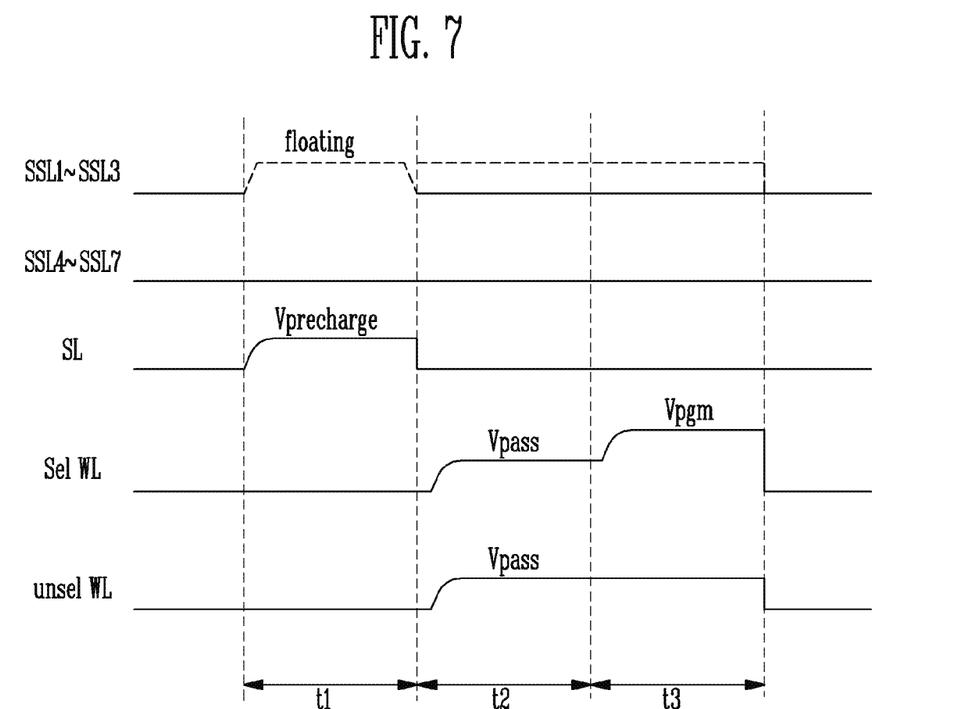
FIG. 7 is a waveform diagram of signals illustrating the program operation of the memory device according to an exemplary embodiment of the present disclosure.

FIG. 7 is a waveform diagram of signals illustrating the program operation of the memory device according to an exemplary embodiment of the present disclosure.

The program operation of the memory device according to the exemplary embodiments of the present disclosure will be described as follows with reference to FIGS. 1 to 7.

When command CMD corresponding to the program operation is received from memory controller 1200 (S610), a source line precharge (SL precharge) operation can be performed (S620 and S630). Subsequently, a program voltage applying operation can be performed (S640).

Specifically, when command CMD corresponding to the program operation is received from memory controller 1200 (S610), control logic 300 generates and outputs operation signal OP_CMD, row decoder control signals AD_signals1 and AD_signals2, source line control signal CTRL_SL, and page buffer control signals PBSIGNALS, which control peripheral circuit 200, to perform the program operation of memory device 1100.

In SL precharge operation period t1, row decoder 220 controls source select transistors SST1 to SST7 included in an unselected memory block among a plurality of memory blocks sharing source line SL in response to row decoder control signals AD_signals2. For example, row decoder 220 floats some source select transistors (e.g., SST1 to SST3) adjacent to source line SL among the plurality of source select transistors SST1 to SST7 included in the unselected memory block, and applies a turn-off voltage (e.g., a ground voltage) to the other source select transistors SST4 to SST7 (S620). Subsequently, source line driver 270 precharges source line SL by applying precharge voltage Vprecharge to source line SL in response to source line control signal CTRL_SL (S630). In addition to the unselected memory block, a memory block selected in the program operation can identically control source select transistors SST1 to SST7.

In a manufacturing process of memory cell array 100, junction regions can be formed to overlap with each other at a lower channel portion of string ST coupled to source line SL, i.e., in a channel of source select transistors (e.g., SST1 to SST3) adjacent to source line SL among source transistors SST1 to SST7 through a doping process so as to generate a GIDL in an erase operation. Hence, the channel of the source select transistors (e.g., SST1 to SST3) adjacent to source line SL can be a conductive layer. Therefore, when the precharge voltage is applied to source line SL and the ground voltage is applied to gates of source select transistors (e.g., SST1 to SST3) adjacent to source line SL in the SL precharge operation, source select transistors SST1 to SST3 operate as capacitors, and hence a large loading of source line SL occurs in the SL precharge operation. In order to prevent this, the capacitance of source line SL can be decreased by floating source select transistors (e.g., SST1 to SST3) having the junction regions that overlap with each other. Thus, the loading of source line SL is reduced in the SL precharge operation. Accordingly, the speed of the SL precharge operation is improved, and the efficiency of a pump circuit (not shown) for precharging source line SL is improved.

In the above-described SL precharge operation (t1, S610, and S620), page buffer group 230 temporarily stores data DATA received through input/output circuit 250 and column decoder 240 in response to page buffer control signals PBSIGNALS, and adjusts voltage levels of bit lines BL1 to BLm according to the stored data.

Voltage generating circuit 210 generates pass voltage Vpass, program voltage Vpgm, and a turn-on voltage in response to operation signal OP_CMD. In period t2, row decoder 220 controls channels of strings included in the selected memory block to have potential levels of bit lines BL1 to BLm by applying the turn-on voltage to drain select line DSL and applying the pass voltage to word lines WL1 to WLn of the selected memory block in response to row decoder control signals AD_signals1 and AD_signals2.

Subsequently, in period t3, memory cells coupled to selected word line Sel WL among word lines WL1 to WLn are programmed by applying program voltage Vpgm to selected word line Sel WL (S640).

Although a case where source select transistors SST1 to SST3 among the plurality of source select transistors SST1 to SST7 are floated in the SL precharge operation is described in the exemplary embodiment of the present disclosure, the present disclosure is not limited thereto, and at least one source select transistor adjacent to the source line among the plurality of source select transistors SST1 to SST7 can be floated.

In addition, as shown in FIG. 7, at least one source select transistor adjacent to the source line among the plurality of source select transistors SST1 to SST7 can maintain a floating state not only in SL precharge operation period t1 but also in periods t2 and t3 in which the pass voltage and the program voltage are applied, or selectively maintain the floating state only in SL precharge operation period t1.

Figure 8:
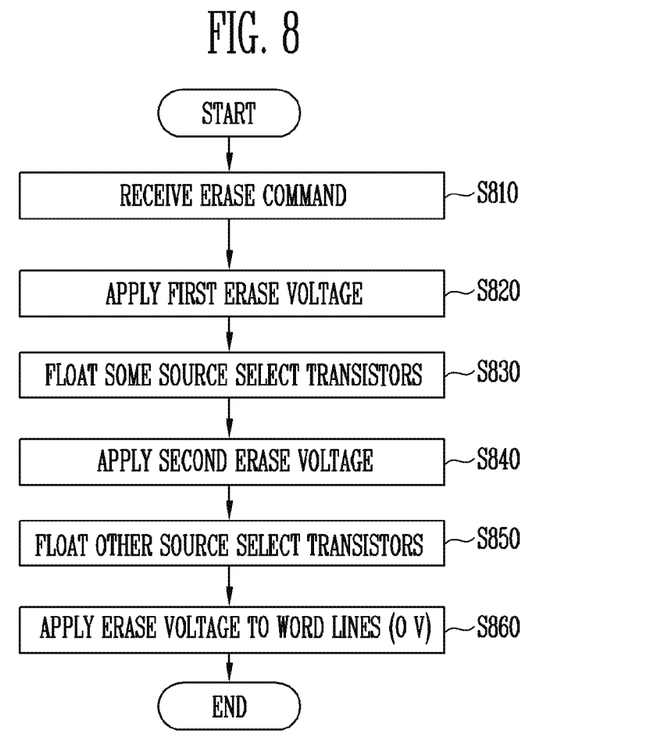
FIG. 8 is a flowchart illustrating an erase operation of the memory device according to an exemplary embodiment of the present disclosure.

FIG. 8 is a flowchart illustrating an erase operation of the memory device according to an exemplary embodiment of the present disclosure.

Figure 9:
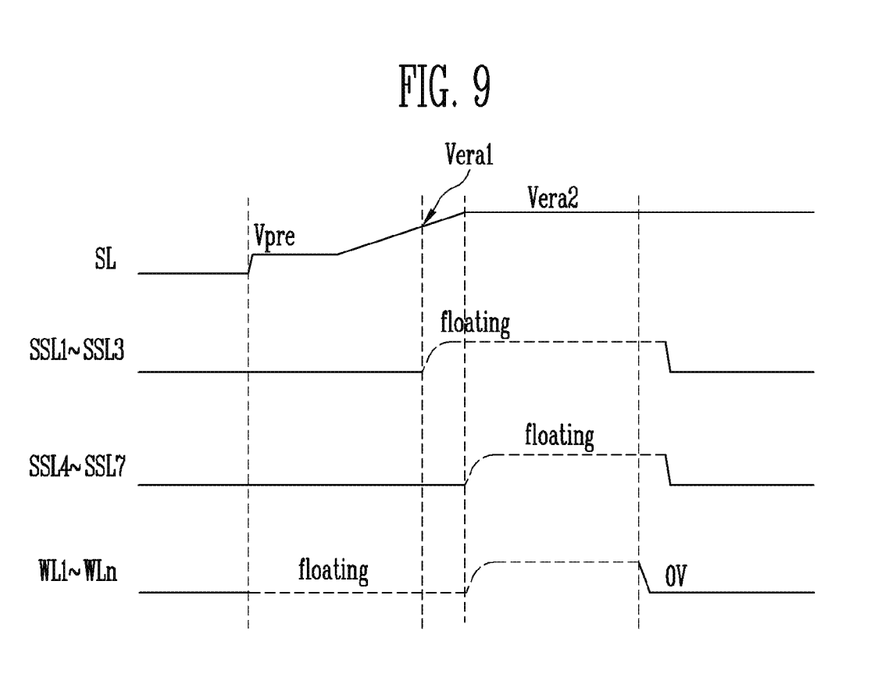
FIG. 9 is a waveform diagram of signals illustrating the erase operation of the memory device according to an exemplary embodiment of the present disclosure.

FIG. 9 is a waveform diagram of signals illustrating the erase operation of the memory device according to an exemplary embodiment of the present disclosure.

The erase operation of the memory device according to the exemplary embodiments of the present disclosure will be described as follows with reference to FIGS. 1 to 5, 8, and 9.

When command CMD corresponding to the erase operation is received from memory controller 1200 (S810), control logic 300 generates and outputs operation signal OP_CMD, row decoder control signals AD_signals1 and AD_signals2, source line control signal CTRL_SL, and page buffer control signals PBSIGNALS, which control peripheral circuit 200, to perform the erase operation of memory device 1100.

Source line driver 270 applies pre-erase voltage Vpre to source line SL and then gradually increases pre-erase voltage Vpre in source line control signal CTRL_SL. Row decoder 220 controls word lines WL1 to WLn of a selected memory block to be in the floating state.

Subsequently, when first erase voltage Vera1 is applied to source line SL since pre-erase voltage Vpre is gradually increased (S820), row decoder 220 floats some source select transistors (e.g., SST1 to SST3) adjacent to source line SL among source select transistors SST1 to SST7 to which a ground voltage is applied (S830). A GIDL is generated in a lower channel of source select transistors SST1 to SST3 due to a potential level difference between gates of source select transistors SST1 to SST3 and source line SL, and the generation of the GIDL is stopped when source select transistors SST1 to SST3 are floated. Therefore, source select transistors SST1 to SST3 are influenced by a first GIDL voltage due to the generated GIDL only until first erase voltage Vera1 is applied to source line SL.

Subsequently, when second erase voltage Vera2 higher than first erase voltage Vera1 is applied to source line SL since the voltage applied to source line SL is continuously increased (S840), row decoder 220 floats other source select transistors SST4 to SST7 to which the ground voltage is applied (S850). A GIDL is generated in a lower channel of source select transistors SST4 to SST7 due to a potential level difference between a voltage applied to gates of source select transistors SST4 to SST7 and second erase voltage Vera2 applied through the lower channel of source select transistors SST1 to SST3, and the generation of the GIDL is stopped when source select transistors SST4 to SST7 are floated. Therefore, the source select transistors SST4 to SST7 are influenced by a second GIDL voltage higher than the first GIDL voltage.

Subsequently, row decoder 220 controls word lines WL1 to WLn in the floating state to have a ground voltage level. Therefore, electrons stored in a charge storage layer of memory cells MC1 to MCn are detrapped by a channel having a high potential level and word lines WL1 to WLn having the ground voltage level. That is, data stored in memory cells MC1 to MCn are erased (S860).

As described above, according to the exemplary embodiment of the present disclosure, the ground voltage is applied to source select transistors (e.g., SST1 to SST3) adjacent to the source line among the plurality of source select transistors SST1 to SST7 in a state in which a low erase voltage (e.g., the first erase voltage Vera1) is applied to the source line, so that a GIDL voltage is applied to have a low voltage level. Accordingly, the threshold voltage distribution of the source select transistors (e.g., SST1 to SST3) can be prevented from being increased due the GIDL voltage.

Although a case where the GIDL is generated in the lower channel of source select transistors SST1 to SST3 among the plurality of source select transistors SST1 to SST7 in a state in which a low erase voltage is applied to the source line in the erase operation is described in the exemplary embodiments of the present disclosure, the present disclosure is not limited thereto, and the GIDL can be generated in a lower channel of at least one source select transistor adjacent to the source line among the plurality of source select transistors SST1 to SST7 in a state in which a low erase voltage is applied to the source line.

Figure 10:
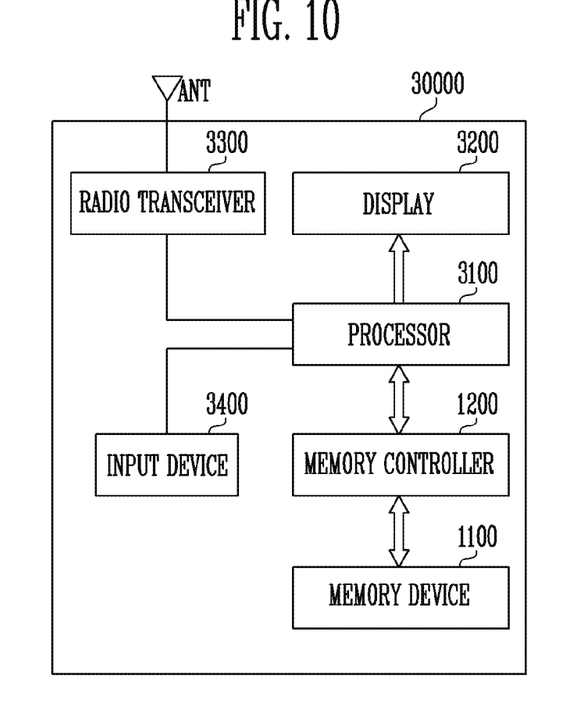
FIG. 10 is a diagram illustrating another exemplary embodiment of the memory system including the memory device shown in FIG. 2.

FIG. 10 is a diagram illustrating another exemplary embodiment of the memory system including the memory device shown in FIG. 2.

Referring to FIG. 10, memory system 30000 can be implemented as a cellular phone, a smart phone, a tablet PC, a personal digital assistant (PDA), or a wireless communication device. Memory system 30000 can include memory device 1100 and memory controller 1200 capable of controlling an operation of memory device 1100. Memory controller 1200 can control a data access operation of memory device 1100, e.g., a program operation, an erase operation, a read operation, or the like under the control of processor 3100.

Data programmed in memory device 1100 can be output through display 3200 under the control of memory controller 1200.

Radio transceiver 3300 can transmit/receive radio signals through antenna ANT. For example, radio transceiver 3300 can change a radio signal received through antenna ANT into a signal that can be processed by processor 3100. Therefore, processor 3100 can process a signal output from radio transceiver 3300 and transmit the processed signal to memory controller 1200 or display 3200. Memory controller 1200 can transmit the signal processed by processor 3100 to memory device 1100. Also, radio transceiver 3300 can change a signal output from processor 3100 into a radio signal, and output the changed radio signal to an external device through antenna ANT. Input device 3400 is a device capable of inputting a control signal for controlling an operation of processor 3100 or data to be processed by processor 3100, and can be implemented as a pointing device such as a touch pad or a computer mouse, a keypad, or a keyboard. Processor 3100 can control an operation of display 3200 such that data output from memory controller 1200, data output from radio transceiver 3300, or data output from input device 3400 can be output through display 3200.

In some exemplary embodiments, memory controller 1200 capable of controlling an operation of memory device 1100 can be implemented as a part of processor 3100, or be implemented as a chip separate from processor 3100.

Figure 11:
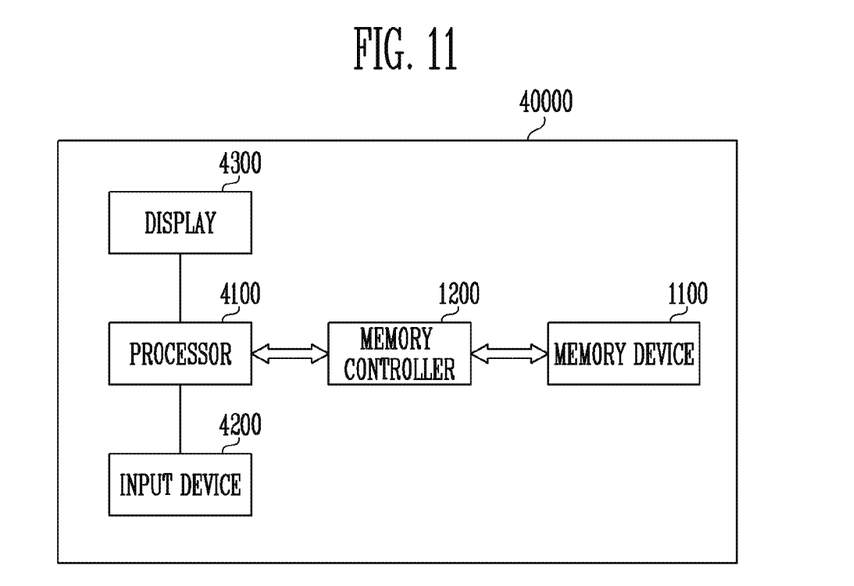
FIG. 11 is a diagram illustrating another exemplary embodiment of the memory system including the memory device shown in FIG. 2.

FIG. 11 is a diagram illustrating another exemplary embodiment of the memory system including the memory device shown in FIG. 2.

Referring to FIG. 11, memory system 40000 can be implemented as a personal computer (PC), a tablet PC, a net-book, an e-reader, a personal digital assistant (PDA), a portable multi-media player (PMP), an MP3 player, or an MP4 player.

Memory system 40000 can include memory device 1100 and memory controller 1200 capable of controlling a data processing operation of memory device 1100.

Processor 4100 can output data stored in the memory device 1100 through display 4300 according to data input through input device 4200. For example, input device 4200 can be implemented as a pointing device such as a touch pad or a computer mouse, a keypad, or a keyboard.

Processor 4100 can control overall operations of memory system 40000, and control an operation of memory controller 1200. In some exemplary embodiments, memory controller 1200 capable of controlling an operation of memory device 1100 can be implemented as a part of processor 4100, or be implemented as a chip separate from processor 4100.

Figure 12:
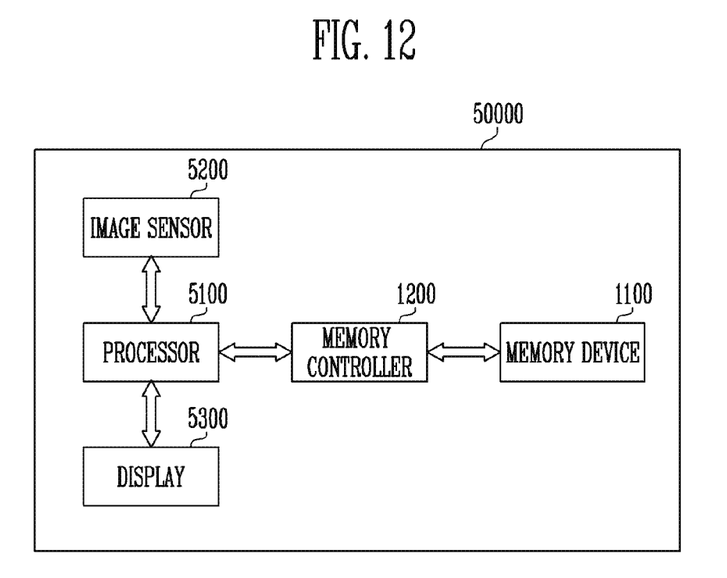
FIG. 12 is a diagram illustrating another exemplary embodiment of the memory system including the memory device shown in FIG. 2.

FIG. 12 is a diagram illustrating another exemplary embodiment of the memory system including the memory device shown in FIG. 2.

Referring to FIG. 12, memory system 50000 can be implemented as an image processing device, e.g., a digital camera, a mobile terminal having a digital camera attached thereto, a smart phone having a digital camera attached thereto, or a tablet PC having a digital camera attached thereto.

Memory system 50000 can include memory device 1100 and memory controller 1200 capable of controlling a data processing operation of memory device 1100, e.g., a program operation, an erase operation, or a read operation.

Image sensor 5200 of memory system 50000 can convert an optical image into digital signals, and the converted digital signals can be transmitted to processor 5100 or memory controller 1200. Under the control of processor 5100, the converted digital signals can be output through display 5300, or be stored in memory device 1100 through memory controller 1200. In addition, data stored in memory device 1100 can be output through display 5300 under the control of processor 5100 or memory controller 1200.

In some exemplary embodiments, memory controller 1200 capable of controlling an operation of memory device 1100 can be implemented as a part of processor 5100, or be implemented as a chip separate from processor 5100.

Figure 13:
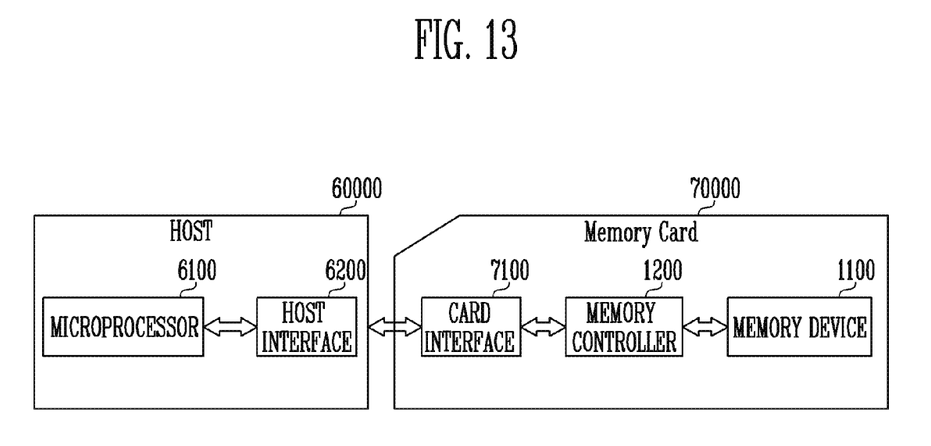
FIG. 13 is a diagram illustrating another exemplary embodiment of the memory system including the memory device shown in FIG. 2.

FIG. 13 is a diagram illustrating another exemplary embodiment of the memory system including the memory device shown in FIG. 2.

Referring to FIG. 13, memory system 70000 can be implemented as a memory card or a smart card. Memory system 70000 can include memory device 1100, memory controller 1200, and card interface 7100.

Memory controller 1200 can control data exchange between memory device 1100 and card interface 7100. In some exemplary embodiments, card interface 7100 can be a secure digital (SD) card interface or a multi-media card (MMC) interface, but the present disclosure is not limited thereto.

Card interface 7100 can interface data exchange between host 60000 and memory controller 1200 according to a protocol of host 60000. In some exemplary embodiments, card interface 7100 can support a universal serial bus (USB) protocol and an inter-chip (IC)-USB protocol. Card interface 7100 can mean hardware capable of supporting a protocol used by host 60000, software embedded in the hardware, or a signal transmission scheme.

When memory system 70000 is coupled to host interface 6200 of host 60000 such as a PC, a tablet PC, a digital camera, a digital audio player, a cellular phone, console video game hardware, or a digital set-top box, host interface 6200 can perform data communication with memory device 1100 through card interface 7100 and memory controller 1200 under the control of microprocessor 6100.

According to the present disclosure, some source select transistors among a plurality of source select transistors are floated in a program operation, so that the capacitance of a source line is decreased. Accordingly, loading of the source line is reduced, so that an SL precharge operation can be improved.

Further, a low GIDL voltage is applied to some source select transistors adjacent to the source line in an erase operation, so that the threshold voltage distribution of the source select transistors can be prevented from being changed due to the GIDL voltage.

While the present disclosure has been shown and described with reference to certain exemplary exemplary embodiments thereof, it will be understood by those skilled in the art that various changes in form and details can be made therein without departing from the spirit and scope of the present disclosure as defined by the appended claims and their equivalents. Therefore, the scope of the present disclosure should not be limited to the above-described exemplary exemplary embodiments but should be determined by not only the appended claims but also the equivalents thereof.

In the above-described exemplary embodiments, all steps can be selectively performed or part of the steps and can be omitted. In each exemplary embodiment, the steps are not necessarily performed in accordance with the described order and can be rearranged. The exemplary embodiments disclosed in this specification and drawings are only examples to facilitate an understanding of the present disclosure, and the present disclosure is not limited thereto. That is, it should be apparent to those skilled in the art that various modifications can be made based upon the technological scope of the present disclosure.

Also, the exemplary exemplary embodiments of the present disclosure have been described in the drawings and specification. Although specific terminologies are used here, those are only to explain the embodiments of the present disclosure. Therefore, the present disclosure is not restricted to the above-described exemplary embodiments and many variations are possible within the spirit and scope of the present disclosure. It should be apparent to those skilled in the art that various modifications can be made based upon the technological scope of the present disclosure in addition to the exemplary embodiments disclosed herein.

What is claimed is:

1. A memory device comprising:
   a memory cell array including a plurality of memory blocks that share a source line;
   a peripheral circuit that performs a program operation and an erase operation on a selected memory block among the plurality of memory blocks; and
   a control logic that controls the peripheral circuit,
   wherein the control logic controls the peripheral circuit such that gates of some source select transistors adjacent to the source line among a plurality of source select transistors included in an unselected memory block among the plurality of memory blocks are floated in a source line precharge operation during the program operation.

2. The memory device of claim 1, wherein each of the plurality of memory blocks includes a string having the plurality of source select transistors, a plurality of memory cells, and a drain select transistor, which are coupled in series between the source line and a bit line.

3. The memory device of claim 1, wherein the control logic controls the peripheral circuit such that other source select transistors except the some source select transistors are in a turn-off state in the source line precharge operation.

4. The memory device of claim 1, wherein the control logic controls the peripheral circuit such that the gates of the some source select transistors adjacent to the source line among the plurality of source select transistors included in the selected memory block among the plurality of memory blocks are floated in the source line precharge operation.

5. The memory device of claim 1, wherein the some source select transistors include at least one source select transistor adjacent to the source line among the plurality of source select transistors.

6. The memory device of claim 1, wherein the peripheral circuit includes:
   a voltage generating circuit that generates an operating voltage applied to word lines of the selected memory block and a plurality of source select lines of each of the plurality of memory blocks in the program operation or the erase operation;
   a source line driver that generates a precharge voltage in the source line precharge operation, and that generates a first erase voltage and a second erase voltage in the erase operation; and
   a row decoder that applies the operating voltage to the word lines of the selected memory block and the plurality of source select lines of each of the plurality of memory blocks, or that floats some source select lines among the plurality of source select lines.

7. The memory device of claim 6, wherein the control logic includes:
   a row decoder control circuit that generates and outputs row decoder control signals for controlling the row decoder in response to a command signal;
   a source line driver control circuit that generates and outputs a source line control signal for controlling the source line driver; and
   a page buffer control circuit that generates and outputs an operation signal for controlling the voltage generating circuit.

8. The memory device of claim 1, wherein the control logic controls the peripheral circuit to apply a program voltage and a pass voltage to word lines of the selected memory block after the source line precharge operation.

9. The memory device of claim 8, wherein the control logic controls the peripheral circuit such that the gates of the some source select transistors are floated only in the source line precharge operation, or controls the peripheral circuit such that the gates of the some source select transistors are floated in a period of the source line precharge operation and the operation of applying the program voltage and the pass voltage to the word lines of the selected memory block.

10. The memory device of claim 1, wherein the control logic controls the peripheral circuit to float the gates of the some source select transistors when a first erase voltage is applied to the source line in the erase operation, and float gates of other source select transistors when a second erase voltage is applied to the source line in the erase operation.

11. A method for operating a memory device, the method comprising:
   floating gates of some source select transistors among a plurality of source select transistors included in an unselected memory block among a plurality of memory blocks each including the plurality of source select transistors, a plurality of memory cells, and a drain select transistor, which are coupled in series between a source line and a bit line;
   applying a precharge voltage to the source line; and
   applying a program voltage and a pass voltage to word lines coupled to a selected memory block among the plurality of memory blocks.

12. The method of claim 11, wherein the some source select transistors include at least one source select transistor adjacent to the source line among the plurality of source select transistors.

13. The method of claim 11, wherein, in the floating of the gates of the some source select transistors, other source select transistors among the plurality of source select transistors are turned off.

14. The method of claim 11, wherein the floating of the gates of the some source select transistors included in the unselected memory block further includes floating gates of the some source select transistors of the selected memory block.

15. The method of claim 11, wherein, in the applying of the program voltage and the pass voltage to the word lines, the some source select transistors included in the unselected memory block maintain a floating state, or are in a turn-off state.

16. A method for operating a memory device, the method comprising:
   providing a memory block including a plurality of source select transistors, a plurality of memory cells, and a drain select transistor, which are coupled in series between a source line and a bit line;
   applying a first erase voltage to the source line;
   floating some source select transistors among the plurality of source select transistors;
   increasing the first erase voltage to a second erase voltage and applying the second erase voltage to the source line; and
   floating other source select transistors among the plurality of source select transistors.

17. The method of claim 16, further comprising applying a pre-erase voltage lower than the first erase voltage to the source line before the first erase voltage is applied.

18. The method of claim 16, wherein a ground voltage is applied to the some source select transistors before the first erase voltage is applied to the source line.

19. The method of claim 16, wherein a ground voltage is applied to the other source select transistors before the second erase voltage is applied to the source line.

20. The method of claim 16, wherein the some source select transistors include at least one source select transistor adjacent to the source line among the plurality of source select transistors.

* * * * *